Figure 1:
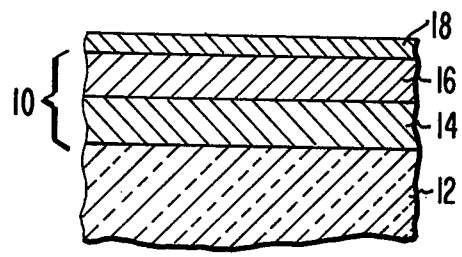

United States Patent [19]

Goel

[11] 4,145,459

[45] Mar. 20, 1979

[54] METHOD OF MAKING A SHORT GATE FIELD EFFECT TRANSISTOR

[75] Inventor: Jitendra Goel, Kendall Park, N.J.

[73] Assignee: RCA Corporation, New York, N.Y.

[21] Appl. No.: 874,701

[22] Filed: Feb. 2, 1978

[51] Int. Cl.² .................. H01L 21/28; H01L 21/285; H01L 21/302

[52] U.S. Cl. .................................. 427/88; 156/643; 156/662; 204/15; 204/192 R; 427/89; 427/92; 427/124; 427/259

[58] Field of Search .................. 427/84, 88, 89, 92, 427/124, 259; 204/15, 192 R; 357/22, 23; 156/643, 662

[56] References Cited

U.S. PATENT DOCUMENTS

| | | | |
|---|---|---|---|
| 3,764,865 | 10/1973 | Napoli et al. | 427/88 |
| 3,898,353 | 8/1975 | Napoli et al. | 427/89 |
| 3,920,861 | 11/1975 | Dean | 427/88 |
| 3,951,708 | 4/1976 | Dean | 427/91 |

Primary Examiner—John D. Smith
Attorney, Agent, or Firm—H. Christoffersen; D. S. Cohen

[57] ABSTRACT

A short gate field effect transistor having a gate on the bottom of a recess in a body of semiconductor material with the source and drain being on the surface of the semiconductor body at opposite sides of the recess is made by providing a metal film on the surface of the semiconductor body with the metal film having an opening therein. A recess is formed in the portion of the semiconductor body in the opening in the metal film. While protecting the bottom portion of the recess, metal films are plated up on each side of the recess until the spacing between the metal films across the recess is equal to the desired length of the gate. The gate is then deposited on the bottom of the recess using the plated metal films as a mask to control the length of the gate.

7 Claims, 4 Drawing Figures

METHOD OF MAKING A SHORT GATE FIELD EFFECT TRANSISTOR

This present invention relates to a method of making a field effect transistor and particularly to a method of making such a transistor having a very short gate, e.g., submicron in length.

U.S. Pat. No. 3,764,865 to L. S. Napoli et al., issued Oct. 9, 1973, entitled "SEMICONDUCTOR DEVICES HAVING CLOSELY SPACED CONTACT," discloses a field effect transistor having a gate on the bottom surface of a groove in the surface of a body of semiconductor material, and source and drain contacts on the surface of the semiconductor body adjacent opposite sides of the groove. This type of field effect transistor has the edges of the gate contact close to and aligned with the adjacent edges of the source and drain contacts.

For certain type of operations, particularly high frequency operation, it is desired that the field effect transistor have a very short gate length, e.g., submicron in length. By gate length it is meant the distance across the gate from the source to the drain. Initially the length of the gate was defined using photolithographic techniques wherein a mask was used to define the length of the gate. However, using such technique it is very difficult, if at all possible, to form masks which will define regions having such submicron short lengths. Therefore, several other techniques have been developed to form short length gates. For example, in U.S. Pat. No. 3,920,861 to R. H. Dean, issued Nov. 18, 1975, entitled "METHOD OF MAKING A SEMICONDUCTOR DEVICE," there is described a controlled etching technique for forming small openings which define the length of the gate. U.S. Pat. No. 3,898,353 to L. S. Napoli et al., issued Aug. 5, 1975, entitled "SELF ALIGNED DRAIN AND GATE FIELD EFFECT TRANSISTOR," and U.S. Pat. No. 3,951,708, to R. H. Dean, issued Apr. 20, 1976, entitled "METHOD OF MANUFACTURING A SEMICONDUCTOR DEVICE," each describe the use of angle evaporation for forming small openings for defining the length of the gate. However, these techniques have the disadvantage of being complex and requiring a great number of steps.

In the Drawings:

FIGS. 1–4 are each sectional views illustrating the various steps of the method of the present invention for making a field effect transistor having a short gate.

Referring to FIG. 1, the method of the present invention starts with a body 10 of semiconductor material, such as silicon, gallium arsenide or the like. As shown, the semiconductor material body 10 is on a substrate 12 of an insulating or semi-insulating material, such as sapphire, spinel, or semi-insulating gallium arsenide. The semiconductor material body 10 is shown as being made up of a layer 14 of one conductivity type, such as N type, having a second layer 16 of the same conductivity type, but higher concentration of the conduction modifier, such as N+ type. The layer 14 will serve as the active region of the transistor with the higher conductivity layer 16 forming contact regions for the active layer 14. On the second layer 16 is a thin film 18 of a conductive metal, such as gold. The adherence of a gold thin film 18 to the semiconductor body may be improved by including a layer of titanium or chromium between the gold and the semiconductor material. The thin metal film 18 can be deposited on the semiconductor layer 16 by any well-known technique, such as sputtering or vacuum deposition.

Figure 2:
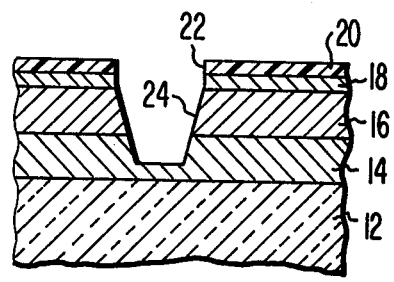

A layer 20 of a photoresist material (FIG. 2) is then applied to the metal film 18 and provided with an opening 22 therein using a standard photolithographic technique. The width of the opening 22 is slightly wider than the desired length of the gate of the field effect transistor whereby the opening can be achieved using a standard mask. As shown in FIG. 2, the portion of the metal film 18 exposed through the opening 22 is then removed using a suitable etchant. A groove 24 is then formed in the exposed portion of the semiconductor body 10 with the groove 24 extending through the second layer 16 and partially through the active layer 14. The groove may be formed with a suitable etchant or by ion beam milling. If the groove 24 is formed by etching, the sidewalls will generally taper away from each other and will undercut the metal film 18.

Figure 3:
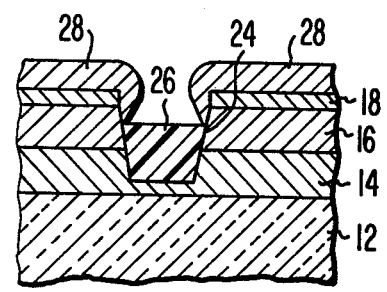
Figure 4:
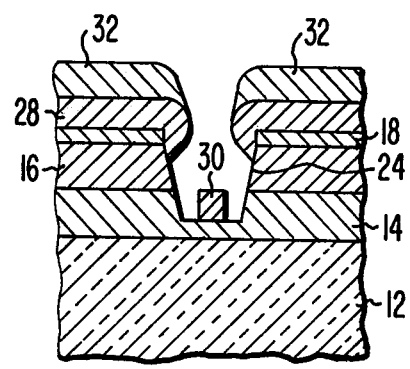

The photoresist layer 20 can then be removed using a suitable solvent. As shown in FIG. 3, the groove 24 is then substantially filled with a protective material 26, such as a photoresist or similar resin. The groove 24 is filled with the protective material 26 to a point just below the thin metal film 18. Metal layers 28, such as gold is then electroplated onto the metal film 18 and the unprotected portions of the sides of the groove 24. As shown in FIG. 3, as the thickness of the metal layers 28 increases, the spacing between the metal layers across the groove 24 decreases. The metal layers 28 are plated up to a thickness such that the spacing between the metal layers across the groove 24 is equal to the desired length of the gate of the field effect transistor. Since the plating of the metal layers 28 can be accurately controlled by the plating conditions and time of plating, a very narrow spacing between the metal layers across the groove 24 can be accurately achieved.

The protective material 26 is then removed using a suitable solvent. A gate 30 of a conductive metal, is then deposited on the bottom of the groove 24 by sputtering or vacuum evaporation. In this process, the metal vapors are formed, pass through the opening between the metal layers 28, which act as a mask, and deposit by condensing on the bottom of the groove 24. Thus, the length of the gate 30 is controlled by the spacing between the metal layers 28 whereby very short length gates can be achieved. At the same time that the gate 30 is deposited on the bottom of the groove 24, the metal of the gate 30 will also deposit on the metal layers 28 to form contact layers 32. Thus there is provided a field effect transistor having source and drain contacts 32, with a gate 30 therebetween, with the gate being capable of being made of very short length, e.g., a length less than 1 micron.

I claim:

1. A method of making a field effect transistor of the type having a short length gate on the bottom of a groove in a body of semiconductor material and source and drain regions on the surface of the semiconductor body at opposite sides of the groove, said method comprising the steps of,
    (a) forming a groove in the surface of a body of semiconductor material,
    (b) while protecting the bottom of the groove from having any metal deposited thereon, depositing metal layers on said surface of the semiconductor body at opposite sides of the groove so that the metal layers project partially across the groove until the spacing between the metal layers across the groove is substantially equal to the desired length of the gate, and (c) depositing a metal gate film on the bottom of the groove with the metal layers on the surface of the semiconductor body serving as a mask to control the length of the gate film.

2. The method in accordance with claim 1 in which the bottom of the groove is protected by substantially filling the groove with a protection material which is removed prior to step (c).

3. The method in accordance with claim 2 in which step (b) comprises plating the metal on the surface of the semiconductor body to form the metal layers and continuing the plating to build up the thickness of the layer until the desired spacing between the layers across the groove is obtained.

4. The method in accordance with claim 3 in which the metal layers are plated on portions of the walls of the groove adjacent the surface of the semiconductor body as well as on the surface of the body.

5. The method in accordance with claim 4 in which prior to step (b) a metal film is provided on the surface of the semiconductor body and the metal layers are plated on the metal film.

6. The method in accordance with claim 2 in which step (c) includes forming vapors of the metal, passing the vapors through the space between the metal layers and condensing the metal vapors on the bottom of the groove.

7. The method in accordance with claim 6 in which the vapors of the gate metal are also condensed on the metal layers to form source and drain contacts.

* * * * *